(12) United States Patent
Ryoki et al.

(10) Patent No.: US 11,441,237 B2
(45) Date of Patent: Sep. 13, 2022

(54) RAMO₄ SUBSTRATE AND METHOD OF MANUFACTURE THEREOF, AND GROUP III NITRIDE SEMICONDUCTOR

(71) Applicant: Panasonic Intellectual Property Management Co., Ltd., Osaka (JP)

(72) Inventors: Naoya Ryoki, Osaka (JP); Kentaro Miyano, Osaka (JP); Masaki Nobuoka, Nara (JP); Akihiko Ishibashi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 322 days.

(21) Appl. No.: 16/691,542

(22) Filed: Nov. 21, 2019

(65) Prior Publication Data

US 2020/0181801 A1 Jun. 11, 2020

(30) Foreign Application Priority Data

Dec. 10, 2018 (JP) .............................. JP2018-230734

(51) Int. Cl.
*H01L 29/15* (2006.01)
*C30B 29/26* (2006.01)
(Continued)

(52) U.S. Cl.
CPC .............. *C30B 29/26* (2013.01); *C30B 15/22* (2013.01); *C30B 25/183* (2013.01);
(Continued)

(58) Field of Classification Search
CPC ....... C30B 15/22; C30B 25/183; C30B 29/26; C30B 29/406; H01L 29/2003; H01L 29/205
See application file for complete search history.

(56) References Cited

U.S. PATENT DOCUMENTS 6,878,962 B1 * 4/2005 Kawasaki ........... H01L 21/0254
257/E29.295
10,246,796 B2 * 4/2019 Tashiro .................... C01F 17/34
(Continued)

FOREIGN PATENT DOCUMENTS

JP 3-276044 12/1991
JP 2008-308401 12/2008
(Continued)

*Primary Examiner* — Jay C Kim
(74) *Attorney, Agent, or Firm* — Wenderoth, Lind & Ponack, L.L.P.

(57) ABSTRACT

A RAMO₄ substrate that does not easily crack during or after the formation of group III nitride crystal includes a single crystal represented by general formula RAMO₄ (wherein R represents one or more trivalent elements selected from the group consisting of Sc, In, Y, and lanthanoid elements, A represents one or more trivalent elements selected from the group consisting of Fe(III), Ga, and Al, and M represents one or more divalent elements selected from the group consisting of Mg, Mn, Fe(II), Co, Cu, Zn, and Cd). The RAMO₄ substrate has a crystal plane with a curvature radius r of 52 m or more, and a square value of correlation coefficient ρ of 0.81 or more. The curvature radius r is calculated as an absolute value from X-ray peak position ωi and measurement position Xi after the measurements of X-ray peak positions ωi at a plurality of positions Xi lying on a straight line passing through the center of the RAMO₄ substrate. The correlation coefficient ρ is a measure of correlation between ω and measurement position Xi.

8 Claims, 4 Drawing Sheets

(51) Int. Cl.
*H01L 29/20* (2006.01)
*H01L 29/205* (2006.01)
*C30B 25/18* (2006.01)
*H01L 21/02* (2006.01)
*C30B 15/22* (2006.01)
*C30B 29/40* (2006.01)

(52) U.S. Cl.
CPC ........ *C30B 29/406* (2013.01); *H01L 21/0242* (2013.01); *H01L 21/02458* (2013.01); *H01L 29/2003* (2013.01); *H01L 29/205* (2013.01)

(56) References Cited

U.S. PATENT DOCUMENTS

| | | |
|---|---|---|
| 10,304,740 B2 * | 5/2019 | Komatsu ............ H01L 21/02433 |
| 10,350,725 B2 * | 7/2019 | Takasu .................... C30B 29/22 |
| 10,411,154 B2 * | 9/2019 | Ueta ..................... C30B 29/406 |
| 10,767,277 B2 * | 9/2020 | Miyano ................... C30B 29/22 |
| 2010/0148212 A1 | 6/2010 | Fujito et al. |
| 2012/0087473 A1 | 4/2012 | Omote et al. |
| 2013/0001586 A1 | 1/2013 | Beaumont et al. |
| 2014/0147650 A1 | 5/2014 | Jiang et al. |
| 2017/0338358 A1 | 11/2017 | Tanaka et al. |

FOREIGN PATENT DOCUMENTS

| | | |
|---|---|---|
| JP | 2014-111527 | 6/2014 |
| JP | 2014-520748 | 8/2014 |
| JP | 2015-068679 | 4/2015 |
| JP | 2015-178448 | 10/2015 |
| WO | 2010/119844 | 10/2010 |
| WO | 2016/152462 | 9/2016 |

* cited by examiner

100 RESISTANCE HEATING FURNACE

200 HIGH-FREQUENCY HEATING FURNACE

300 GROUP III NITRIDE SEMICONDUCTOR

RAMO₄ SUBSTRATE AND METHOD OF MANUFACTURE THEREOF, AND GROUP III NITRIDE SEMICONDUCTOR

TECHNICAL FIELD

The present disclosure relates to a RAMO$_4$ substrate and a method of manufacture thereof, and to a group III nitride semiconductor.

BACKGROUND

A RAMO$_4$ substrate is a substrate formed of a single crystal represented by general formula RAMO$_4$ (wherein R represents one or more trivalent elements selected from the group consisting of Sc, In, Y, and lanthanoid elements, A represents one or more trivalent elements selected from the group consisting of Fe(III), Ga, and Al, and M represents one or more divalent elements selected from the group consisting of Mg, Mn, Fe(II), Co, Cu, Zn, and Cd). The RAMO$_4$ substrate has attracted interest as a base substrate for forming group III nitride crystals such as gallium nitride (GaN).

A ScAlMgO$_4$ substrate, an example of RAMO$_4$ substrate, has a lattice mismatch with GaN that is about 1/10 of that of sapphire, a traditional base substrate. By forming GaN with a ScAlMgO$_4$ single crystal used as a base substrate, it would then be possible to obtain high-quality GaN crystals having small dislocation defect density.

JP-A-2015-178448 discloses a method that includes forming an amorphous or polycrystalline buffer layer on a ScAlMgO$_4$ substrate at a low temperature of about 600° C., and forming a GaN monocrystalline thin film at a high temperature of 1,050° C. using metal organic chemical vapor deposition (MOCVD).

However, a problem with the method described in the foregoing related art is that warping occurs in the base substrate after the formation of the GaN monocrystalline thin film, and the base substrate cracks in areas of concentrated stress because of the lattice mismatch and the linear expansion coefficient difference between the base substrate and GaN. There accordingly is a need for a base substrate that does not easily crack during or after the fabrication of group III nitride crystals.

SUMMARY

An object of the present disclosure is to provide a RAMO$_4$ substrate that does not easily crack during or after the formation of group III nitride crystal.

The present disclosure provides a RAMO$_4$ substrate comprising a single crystal represented by general formula RAMO$_4$ (wherein R represents one or more trivalent elements selected from the group consisting of Sc, In, Y, and lanthanoid elements, A represents one or more trivalent elements selected from the group consisting of Fe(III), Ga, and Al, and M represents one or more divalent elements selected from the group consisting of Mg, Mn, Fe(II), Co, Cu, Zn, and Cd), the RAMO$_4$ substrate having a crystal plane with a curvature radius r of 52 m or more, and a square value of correlation coefficient ρ of 0.81 or more, wherein the curvature radius r is calculated as an absolute value from a regression line obtained from a relationship between X-ray peak position ωi and position Xi after the X-ray peak position ωi is specified in a diffraction spectrum of an X-ray rocking curve measured at each of a plurality of positions Xi (i=1, 2, 3, . . . , n) lying on a straight line passing through a center of the RAMO$_4$ substrate, and wherein the square value of correlation coefficient ρ is calculated from the X-ray peak position ωi and the position Xi using the following formula, $$\rho = \frac{\frac{1}{n}\sum_{i=1}^{n}(Xi - \overline{X})(\omega i - \overline{\omega})}{\sqrt{\frac{1}{n}\sum_{i=1}^{n}(Xi - \overline{X})^2}\sqrt{\frac{1}{n}\sum_{i=1}^{n}(\omega i - \overline{\omega})^2}}$$

wherein $\overline{\omega}$ represents a mean value of ωi, and $\overline{X}$ represents a mean value of Xi.

With the present disclosure, a RAMO$_4$ substrate can be provided that does not easily crack during or after the formation of group III nitride crystal.

DESCRIPTION OF EMBODIMENTS

Figure 1:
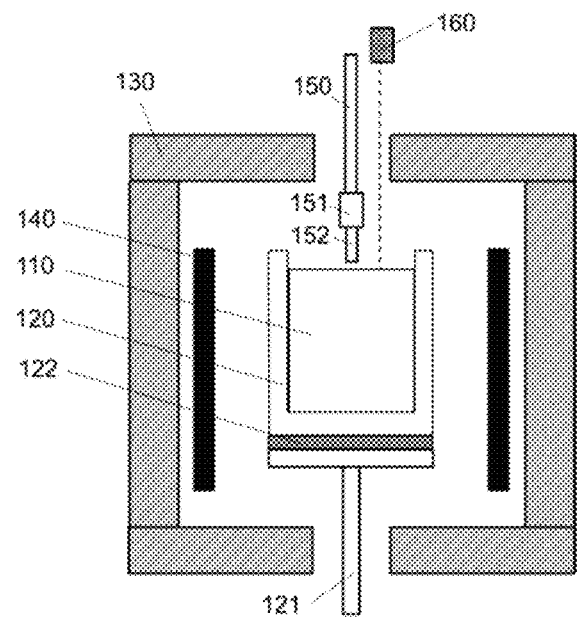
FIG. 1 is a schematic view representing a resistance heating furnace used in a method of manufacture of a RAMO$_4$ substrate of an embodiment of the present disclosure.
Figure 2:
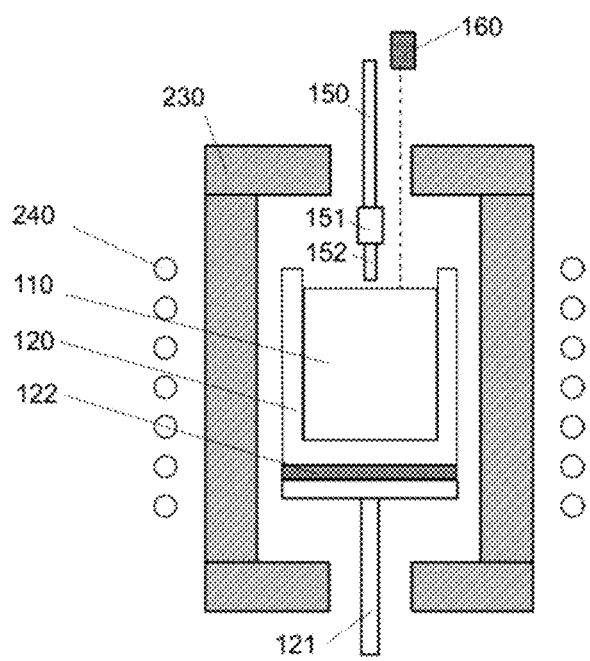
FIG. 2 is a schematic view representing a high-frequency heating furnace used in a method of manufacture of a RAMO$_4$ substrate of an embodiment of the present disclosure.

An embodiment of the present disclosure is described below with reference to the accompanying drawings.
Crystal Growth Step The constituent RAMO$_4$ single crystal of a RAMO$_4$ substrate according to an embodiment of the present disclosure can be fabricated by using the Czochralski method (hereinafter, also referred to as "CZ method") with a crystal pulling device. The crystal pulling device used in the crystal growth step of the present embodiment includes a resistance heating furnace and a high-frequency heating furnace. FIG. 1 is a schematic view representing a configuration of a resistance heating furnace 100. FIG. 2 is a schematic view representing a configuration of a high-frequency heating furnace 200. The following describes a method for manufacturing a $RAMO_4$ single crystal ($RAMO_4$ substrate) by resistance heating or high-frequency heating, taking as an example production of a $ScAlMgO_4$ single crystal, an example of $RAMO_4$ single crystal. It is to be noted, however, that the $RAMO_4$ single crystal ($RAMO_4$ substrate) applicable in the present disclosure is not limited to the $ScAlMgO_4$ single crystal ($ScAlMgO_4$ substrate).

The resistance heating furnace 100 illustrated in FIG. 1 includes a feedstock 110, a crucible 120, a crucible supporting rod 121, a refractory 122, a heat insulating material 130, a heater 140, a crystal pulling rod 150, a seed holder 151, a seed crystal 152, and a melt-level-position detector 160. The resistance heating furnace 100 may also include other components required for pulling a crystal by the CZ method, for example, such as a chamber, a vacuum pump, a gas supply, a gas outlet, a heater power supply, and temperature and gas-flow controllers, though not shown in FIG. 1.

The feedstock 110 is a mixture of scandium oxide ($Sc_2O_3$), aluminum oxide ($Al_2O_3$), and magnesium oxide (MgO). In order to improve charge density, the mixture is sintered before being charged into the crucible 120, prior to heating and melting.

The crucible 120 is made of iridium, and is charged with the feedstock 110. The material of the crucible 120 is not limited to this, and various materials may be used, provided that the material is heat resistant against the melting temperature of the feedstock 110, and is resistant to reaction with the feedstock 110. Examples of the material of the crucible 120 include platinum, tungsten, molybdenum, and tantalum.

The crucible supporting rod 121 is made of tungsten, and functions to rotate, and move up and down, at set speeds. The material of the crucible supporting rod 121 is not limited to this, and various materials may be used that are resistant to the heated temperature of the crucible supporting rod 121, and that have strength to support the feedstock 110 and the crucible 120.

The refractory 122 is made of zirconia, and is resistant to reaction with the materials of the crucible 120 and the crucible supporting rod 121.

The heat insulating material 130 is made of carbon, and has an upper through hole for insertion of the crystal pulling rod 150, and a lower through hole for insertion of the crucible supporting rod 121.

The heater 140 is a columnar member made of carbon, and generates heat upon passing current. The generated heat from the heater 140 heats the whole atmosphere inside the heat insulating material 130, thereby heating the feedstock 110 inside the crucible 120. The material of the heater 140 is not limited to carbon, and may be a metallic material such as tungsten.

The crystal pulling rod 150 is made of alumina, and functions to rotate, and move up and down, at set speeds. The material of the crystal pulling rod 150 is not limited to this, and various materials may be used that are resistant to the heated temperature of the crystal pulling rod 150, and that are resistant to reaction with the ambient atmosphere.

The seed holder 151 is made of iridium, and is connected to the crystal pulling rod 150. The seed crystal 152 can be set at the tip of the seed holder 151. The material of the seed holder 151 is not limited to this, and various materials may be used that are heat resistant against the melting temperature of the feedstock, and that are resistant to reaction with the seed crystal 152.

The seed crystal 152 is a $ScAlMgO_4$ crystal having a square prism shape. However, the shape is not limited to this, as long as it is workable. The seed crystal 152 may have a shape of, for example, a circular cylinder, or a rectangular column having a cutout.

The melt-level-position detector 160 is an area sensor camera that captures images of the feedstock 110 at the melt surface, and areas around the seed crystal 152, and detects the vertical level of the melt by image processing. The mechanism of the melt-level-position detector 160 is not limited to this, and a laser displacement meter or an ultrasonic level sensor may be used, for example.

For heating and melting of the feedstock 110 and crystal growth, the atmosphere inside the resistance heating furnace 100 is replaced with the desired gas atmosphere. Specifically, after creating a vacuum in the resistance heating furnace 100, a predetermined gas is introduced until the pressure reaches ordinary pressure. The gas is sent into the resistance heating furnace 100 from a gas supply (not illustrated) provided outside of the resistance heating furnace 100.

The gas species used is normally inert gas argon. However, the gas species is not limited to this. For example, in order to prevent oxygen depletion in the crystal, a mixed gas of argon with 1 volume % or less of oxygen relative to argon may be used. In order to prevent the feedstock 110 from reduction, a mixed gas of argon with 1 volume % or less of carbon dioxide relative to argon may be used. It is also possible to use other inert gas, such as helium, instead of argon. For cost considerations, it is, however, desirable to use argon as inert gas because argon is available at relatively low cost.

After creating the foregoing gas atmosphere by replacement, the feedstock 110 is heated and melted for crystal growth. First, current is passed through the heater 140 to heat inside of the resistance heating furnace 100. Here, the power applied to the heater 140 is gradually increased over a time period long enough to melt the feedstock 110 charged into the crucible 120 but short enough not to overload the crucible 120. The heating and melting time depends on the size of the crucible 120, and is preferably 15 hours to 60 hours for a crucible 120 having an outer diameter of 80 mm to 150 mm.

After checking that the feedstock 110 has melted, the crystal pulling rod 150 rotated at a certain speed is gradually moved down until the seed crystal 152 touches the feedstock 110. The crystal is pulled up by lifting the crystal pulling rod 150 at a predetermined speed after the temperature of the feedstock 110 has stabilized at a temperature suited for pulling the crystal. The upper end of the crystal pulling rod 150 has a load cell (not illustrated), enabling weight measurement of the crystal being pulled up. After the pulling has started, the heater output is adjusted according to the crystal diameter calculated from the measured weight. The crystal is controlled to have the desired shape by automatic diameter control (ADC). In the present embodiment, the pulling rate of the crystal pulling rod 150 is preferably 0.1 mm/h to 1.0 mm/h, more preferably 0.3 mm/h to 0.7 mm/h. The rotational speed is preferably 1 rpm to 10 rpm.

After being pulled over a distance of the desired length, the crystal is separated from the feedstock 110, and is cooled by gradually decreasing the applied power to the heater 140 over a length of time that does not place a large load on the crucible 120. The cooling time depends on the size of the crucible 120, and is preferably 20 hours to 70 hours for a crucible 120 having an outer diameter of 80 mm to 150 mm.

The following describes an example based on the high-frequency heating furnace 200 shown in FIG. 2. The high-frequency heating furnace 200 may have the same configuration as the resistance heating furnace 100 of FIG. 1, except that a heating coil 240 is disposed on the outer side a heat insulating material 230, instead of the heater 140 being disposed on the inner side of the heat insulating material 130. The configurations already described with reference to FIG. 1 will be referred to using the same reference numerals, and detailed descriptions of such configurations are omitted.

The heat insulating material 230 is made of zirconia, and is disposed so as to surround the crucible 120.

The heating coil 240 is made of copper, and is disposed so as to surround the heat insulating material 230. A coolant circulates inside the copper tube. Passing a high-frequency current through the heating coil 240 produces a high-frequency magnetic flux. The high-frequency magnetic flux generates eddy-current in the crucible 120, and the surface of the crucible 120 generates heat, heating the feedstock 110 inside the crucible 120.

The high-frequency heating furnace 200 also has a mechanism that moves the heating coil 240 up and down, though not illustrated in the drawing.

For crystal growth using the high-frequency heating furnace 200, the inner atmosphere is replaced with the desired gas atmosphere prior to heating. The gas species used is normally nitrogen. However, the gas species is not limited to nitrogen. In order to prevent oxygen depletion in the crystal, a mixed gas of nitrogen with 1 volume % or less of oxygen relative to nitrogen may be used. In order to prevent the feedstock 110 from reduction, a mixed gas of nitrogen with 1 volume % or less of carbon dioxide relative to nitrogen may be used. It is also possible to use inert gas argon, instead of nitrogen.

The heating and melting of the feedstock 110 and the crystal growth after the replacement of the atmosphere inside the high-frequency heating furnace 200 with the foregoing gas atmosphere are as described above in conjunction with the resistance heating furnace 100.

Substrate Forming Step

After the crystal growth step, the cooled $ScAlMgO_4$ single crystal is taken out, and subjected to processes such as cleaving and surface treatment to obtain a $ScAlMgO_4$ substrate. Here, one of the surfaces of the $ScAlMgO_4$ substrate is used as an epitaxial growth surface. A high-quality group III-nitride semiconductor can be obtained by arranging new crystals in an orderly way with respect to the epitaxial growth surface of the $ScAlMgO_4$ substrate (epitaxial growth). Crystals of compound semiconductors such as group III nitride are grown by epitaxial growth using, for example, the metal organic chemical vapor deposition method (hereinafter, "MOCVD method"), the hydride vapor-phase epitaxy method (hereinafter, "HVPE method"), or the oxide vapor-phase epitaxy method (hereinafter, "OVPE method").

Figure 3:
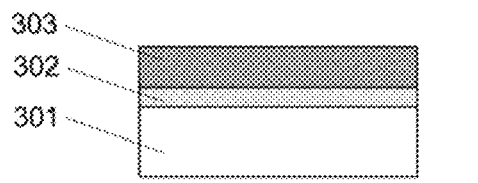
FIG. 3 is a schematic cross sectional view of a group III nitride semiconductor of an embodiment of the present disclosure.

FIG. 3 is a diagram schematically representing a cross section of a group III nitride semiconductor 300 using the $ScAlMgO_4$ substrate of the present embodiment. The group III nitride semiconductor 300 includes a $ScAlMgO_4$ substrate 301 formed of $ScAlMgO_4$ single crystal, a buffer layer 302 formed on the $ScAlMgO_4$ substrate 301 and containing nitrides of indium and other group III elements, and a group III nitride crystal 303 formed on the buffer layer 302.

The $ScAlMgO_4$ single crystal has an alternately stacked structure of a rock-salt-type $ScO_2$ layer and a hexagonal $AlMgO_2$ layer, and has the same property as graphite and hexagonal BN so that the crystals cleave at the (0001) plane (cleave surface). The group III nitride semiconductor 300 can be obtained after the heteroepitaxial growth of group III nitride crystals on the cleave surface of $ScAlMgO_4$ substrate 301 providing an epitaxial growth surface.

However, when the epitaxial growth surface of the $ScAlMgO_4$ substrate 301 has defects, foreign materials, or other such portions that act as a seed for accidental crystalline growth, there are instances where the group III atoms collect in these portions, and locally undergo nonuniform growth. In order to prevent this, the surface of the $ScAlMgO_4$ substrate 301 may be treated to form a plurality of cleave surfaces that are orderly distributed by being separated from one another via steps. Such a treated surface can then be used as an epitaxial growth surface. In the case where GaN (group III nitride) is grown on the $ScAlMgO_4$ substrate 301 using, for example, the MOCVD method, trimethylgallium (TMG) or the like is used as Ga source. In MOCVD, Ga migrates from one epitaxial-growth cleave surface to another while being partly bound to the methyl group. Ga comes to rest upon finding a stable location, and detaches itself from the methyl group before binding to N for epitaxial growth. By forming the cleave surfaces that are separated from one another via steps, it is therefore possible to stabilize the epitaxial growth by making use of the stepped portions of the adjacent cleave surfaces as a stable crystal growth location.

The $ScAlMgO_4$ substrate 301 of the group III nitride semiconductor 300 of the present embodiment has a thickness of preferably 100 μm to 1,000 μm, more preferably 300 μm to 600 μm, though the thickness is appropriately selected according to the use of the group III nitride semiconductor. With the thickness of the $ScAlMgO_4$ substrate 301 falling in these ranges, the occurrence of cracking in the $ScAlMgO_4$ substrate 301 can be reduced during handling of the $ScAlMgO_4$ substrate 301, or during or after the formation of the group III nitride crystal 303. The $ScAlMgO_4$ substrate 301 has an appropriately selected shape that depends on the use of the group III nitride semiconductor. Considering practicality in industrial applications, the $ScAlMgO_4$ substrate 301 has preferably a wafer shape having a diameter of 25 mm to 200 mm.

Group III Nitride Semiconductor

The following more specifically describes the group III nitride semiconductor using the $ScAlMgO_4$ substrate 301.

The buffer layer 302 is a layer containing nitrides of indium and other group III elements. For example, the buffer layer 302 may be an amorphous, monocrystalline, or polycrystalline layer of compounds of the composition represented by InGaN. Preferably, the buffer layer 302 further contains Al, and is more preferably an amorphous, monocrystalline, or polycrystalline layer of compounds represented by InAlGaN. By using InAlGaN for the buffer layer 302, the degree of lattice mismatch between the $ScAlMgO_4$ substrate 301 and the group III nitride crystal 303 can be reduced. This makes it easier to obtain a high-quality group III nitride crystal 303 having less dislocation defect density.

The group III nitride crystal 303 is a layer formed after the heteroepitaxial growth on the epitaxial growth surface of the $ScAlMgO_4$ substrate 301 via the buffer layer 302. In an embodiment, the group III nitride crystal 303 is a layer formed of crystals of nitrides of group III elements (for example, such as Ga, Al, In, Tl, B, and Sc). Preferred is GaN or AlN.

The method of manufacture of the group III nitride semiconductor 300 of the present disclosure is not particularly limited. For example, the buffer layer 302 and the group III nitride crystal 303 may be formed by epitaxial growth of a group III nitride on the ScAlMgO$_4$ substrate 301 using the MOCVD method.

In the case where the buffer layer 302 and the group III nitride crystal 303 are formed by using the MOCVD method, compounds such as trimethylgallium (TMG), trimethylindium (TMI), and trimethylaluminum (TMA) may be used as group III element source. The nitrogen source may be ammonia (NH$_3$) gas. Hydrogen or nitrogen may be used as a carrier gas in MOCVD.

Before starting the MOCVD method, it is preferable to, for example, clean the ScAlMgO$_4$ substrate 301 under heat in a hydrogen atmosphere at 1,100° C. for 10 minutes. Heat cleaning removes carbon dirt and other contamination on the surface of the ScAlMgO$_4$ substrate 301. After cleaning, the surface temperature of the ScAlMgO$_4$ substrate 301 is lowered to, for example, 425° C. This is followed by formation of the buffer layer 302 by depositing nitrides of In and other group III elements on the ScAlMgO$_4$ substrate 301 using the MOCVD method. The buffer layer 302 can be formed typically at a relatively low temperature of 400° C. or more and less than 700° C. The buffer layer 302 formed at such low temperatures forms an amorphous or polycrystalline layer, and the group III nitride crystal 303 formed on the buffer layer 302 becomes less susceptible to lattice defects. The thickness and the composition of the buffer layer 302 are adjusted according to the deposition time and the percentage of the feedstock.

After the deposition of the buffer layer 302, the temperature of the ScAlMgO$_4$ substrate 301 is raised to, for example, 1,125° C., and the group III nitrides are epitaxially grown to obtain the group III nitride crystal 303. The thickness and the composition of the group III nitride crystal 303 are adjusted according to the deposition time and the percentage of the feedstock, as with the case of the buffer layer 302. The group III nitride crystal 303 may be formed at a temperature of 700° C. to 1,300° C. With the group III nitrides epitaxially grown at such a temperature, the resulting group III nitride crystal 303 can have fewer lattice defects.

In the group III nitride semiconductor 300 of the present disclosure, a RAMO$_4$ substrate configured from a substantially single crystalline material represented by general formula RAMO$_4$ may be used in place of the ScAlMgO$_4$ substrate 301. In the general formula, R represents one or more trivalent elements selected from the group consisting of Sc, In, Y, and lanthanoid elements, A represents one or more trivalent elements selected from the group consisting of Fe(III), Ga, and Al, and M represents one or more divalent elements selected from the group consisting of Mg, Mn, Fe(II), Co, Cu, Zn, and Cd. As used herein, "substantially single crystalline material" refers to a crystalline solid containing at least 90 atom % RAMO$_4$ constituting the epitaxial growth surface, and in which any given crystal axis is directed in the same direction anywhere in the epitaxial growth surface. It is noted, however, that crystalline solids having a locally different crystal axis direction, and crystalline solids having local lattice defects are also regarded as single crystals. In the formula, O means oxygen. Preferably, R is Sc, A is Al, and M is Mg, as stated above.

The constituent group III elements of the buffer layer 302 and the group III nitride crystal 303 are particularly preferably gallium (Ga), as stated above. However, for example, other elements such as aluminum (Al), indium (In), and thallium (Tl) also may be used, either alone or in a combination of two or more. The constituent material of the group III nitride crystal 303 may be, for example, at least one selected from the group consisting of aluminum (Al), gallium (Ga), and indium (In). In this case, the group III nitride crystal 303 produced has the composition represented by $Al_sGa_tIn_{(1-(s+t))}N$ (wherein $0 \leq s \leq 1$, $0 \leq t \leq 1$, and $s+t \leq 1$). The group III nitride crystal 303 may also contain, for example, a dopant. The dopant is not particularly limited, and may be, for example, germanium oxide (e.g., Ge$_2$O$_3$, and Ge$_2$O).

The group III nitride crystal 303 may be deposited using other methods, for example, such as HVPE, OVPE, a sputter method, and MBE, instead of the MOCVD method.

Evaluation of ScAlMgO$_4$ Substrate

As mentioned above, warping may occur in a common ScAlMgO$_4$ substrate. In the embodiment, because of the lattice mismatch between the ScAlMgO$_4$ substrate 301 and the group III nitride crystal 303, and the difference of coefficient of thermal expansion between the ScAlMgO$_4$ substrate 301 and the group III nitride crystal 303, the ScAlMgO$_4$ substrate 301 may warp in the cooling step after the formation of the group III nitride crystal 303. This makes the ScAlMgO$_4$ substrate 301 susceptible to cracking in areas of concentrated stress, and poses a serious impact on product yield.

After intensive studies, the present inventors found that the ScAlMgO$_4$ substrate 301 after the formation of the group III nitride crystal 303 becomes resistant to cracking when the curvature radius of the crystal plane of the ScAlMgO$_4$ substrate 301, and the uniformity of crystal orientation are appropriately controlled.

The curvature radius of the crystal plane of the ScAlMgO$_4$ substrate 301, and the uniformity of crystal orientation can be evaluated before forming the buffer layer 302 and the group III nitride crystal 303, using the X-ray diffraction method.

Specifically, X-ray rocking curve measurements are taken on a straight line passing through the substrate center within a plane of the ScAlMgO$_4$ substrate 301, and the X-ray peak position ($\omega$) of each diffraction spectrum is determined. The curvature radius, and the uniformity of crystal orientation are then evaluated from the measurement position (X) and the X-ray peak position ($\omega$).

To describe more specifically, an X-ray rocking curve measurement is taken at each measurement position Xi (i=1, 2, 3, . . . , n, where n is the number of measurement positions) on a straight line passing the substrate center. A regression line represented by the following formula 1 is then specified from a graph representing the data coordinates (Xi, $\omega$i), where $\omega$i is the X-ray peak position corresponding to Xi.

$$\omega = aX + b \quad \text{(Formula 1)}$$

The slope a and intercept b of the regression line, which are determined by the least squares method, are represented by the following formulae 2 and 3, respectively.

$$a = \frac{\sum_{i=1}^{n} \{(Xi - \overline{X})(\omega i - \overline{\omega})\}}{\sum_{i=1}^{n} (Xi - \overline{X})^2} \quad \text{(Formula 2)}$$

$$b = \overline{\omega} - a\overline{X} \quad \text{(Formula 3)}$$

In the formulae, $\overline{\omega}$ is the mean value of $\omega$i, and $\overline{X}$ is the mean value of Xi.

The curvature radius r of the crystal plane of the ScAlMgO₄ substrate 301 is calculated from the following formula 4.

$$r = a\frac{180}{\pi} \quad \text{(Formula 4)}$$

The crystal plane is concave down when the curvature radius r has the positive sign, and is concave up when the curvature radius r has the negative sign. The larger the absolute value of curvature radius r, the smaller the extent of warping in the crystal plane of the substrate. Here, "crystal plane" means the (0001) plane, and is the cleave surface of ScAlMgO₄. Here, "curvature radius r (warping)" refers to not the warping in the work surface of the ScAlMgO₄ substrate, but the warping of the crystal plane, that is, warping of crystal.

The uniformity of crystal orientation can be evaluated from the square ($\rho^2$) of the correlation coefficient $\rho$ of measurement position Xi and X-ray peak position ωi. The correlation coefficient $\rho$ of measurement position Xi and X-ray peak position ωi is calculated from the following formula 5.

$$\rho = \frac{\frac{1}{n}\sum_{i=1}^{n}(Xi - \overline{X})(\omega i - \overline{\omega})}{\sqrt{\frac{1}{n}\sum_{i=1}^{n}(Xi - \overline{X})^2}\sqrt{\frac{1}{n}\sum_{i=1}^{n}(\omega i - \overline{\omega})^2}} \quad \text{(Formula 5)}$$

In the formula, $\overline{\omega}$ is the mean value of ωi, and $\overline{X}$ is the mean value of Xi.

Larger values of $\rho^2$ mean that the crystal axes are better aligned at each point in the crystal plane of the substrate.

The significance of correlation coefficient $\rho$ increases as the number of measurement positions (n) increases. It is accordingly preferable to have large numbers of measurement positions for the evaluation of the uniformity of crystal orientation. In a test of correlation coefficient $\rho$, the threshold of correlation coefficient, that is, the minimum value at which the correlation coefficient $\rho$ is considered significant is set to 0.88 for n=5, 0.81 for n=6, and 0.75 for n=7 at 5% significance level. It is accordingly preferable to have at least six measurement positions, with which a correlation coefficient $\rho$ of 0.81 or more is considered significant. At a more strict 1% significance level, the threshold of correlation coefficient, that is, the minimum value at which the correlation coefficient $\rho$ is considered significant is set to 0.83 for n=8, 0.80 for n=9, and 0.76 for n=10. It is accordingly preferable to have at least nine measurement positions, with which a correlation coefficient $\rho$ of 0.80 or more is considered significant.

After intensive studies, the present inventors found that the curvature radius r of the crystal plane of the ScAlMgO₄ substrate 301, and the uniformity of crystal orientation ($\rho^2$) can be brought to the desired ranges by controlling the shape of the crystal growth boundary in the step of growing the ScAlMgO₄ single crystal.

Figure 4:
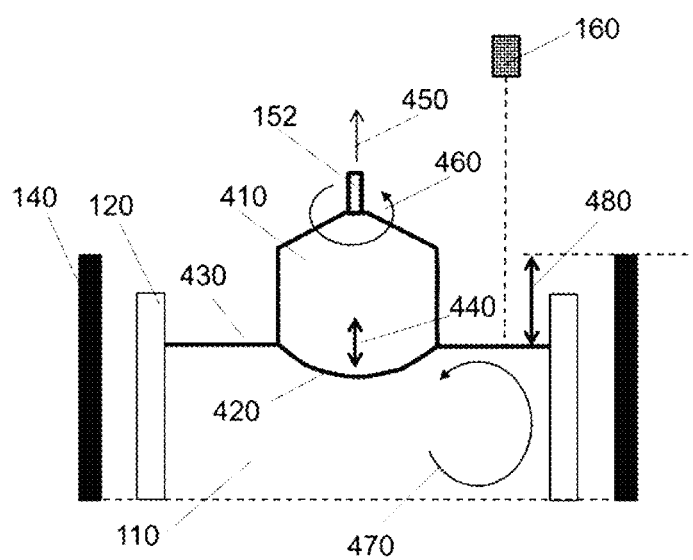
FIG. 4 is a schematic view representing a crystal growth boundary and associated elements in a method of manufacture of a RAMO$_4$ substrate of an embodiment of the present disclosure.

FIG. 4 is a schematic view representing a crystal growth boundary 420 and associated elements in the crystal growth step performed with the resistance heating furnace 100. The crystal growth boundary 420 is the boundary between a crystal 410, which grows out of a seed crystal 152, and a melt of feedstock 110. The shape of the crystal growth boundary 420 is determined primarily by a balance between the temperature gradient 440 near the melt surface of the feedstock 110 (hereinafter, also referred to as "melt level") 430, the pulling rate 450 of the crystal pulling rod, the rotational speed 460 of the crystal pulling rod, and the convection 470 of the melt. The temperature gradient 440 refers to a temperature difference per vertical unit length near the melt surface 430. In the Czochralski method, the rate of solidification of the feedstock 110 from its melt to crystals increases with increase of the temperature gradient 440, and the crystal growth rate per unit time also increases as the temperature gradient 440 increases. Here, the flatness of the crystal growth boundary 420 is disrupted under the load of pulling when the pulling rate 450 of the crystal pulling rod falls outside of the appropriate range relative to the crystal growth rate per unit time. Because the flatness of the crystal growth boundary 420 is directly linked to the curvature radius r of the crystal plane of the ScAlMgO₄ single crystal and the uniformity of crystal orientation ($\rho^2$) after growth, it is of importance to appropriately control the temperature gradient 440 and pulling rate 450. Increasing the rotational speed 460 of the crystal pulling rod promotes convection 470 in the melt, and increases the frequency at which the high-temperature melt near the heater 140 approaches the crystal growth boundary 420. This produces changes in the temperature state near the melt surface 430, and affects the flatness of the crystal growth boundary 420. It is accordingly important to appropriately control the rotational speed 460.

The temperature gradient 440 is determined primarily by factors such as the amount of heat input near the melt surface 430 from the heater 140, the structure of the heat insulating material (not illustrated) around and above the crucible 120, and the flow rate (not illustrated) of the atmospheric gas near the melt surface 430. Particularly, the temperature gradient 440 greatly changes according to the vertical positional relationship between the melt surface 430 and the heater 140. In the embodiment of the present disclosure, the vertical position of the melt surface 430 of the feedstock 110 is measured with a position detector 160 for detecting the melt surface 430. The distance 480 between the melt surface 430 and the upper end of the heater 140 along the crystal pulling direction (hereinafter, also referred to as "vertical distance") is maintained constant by moving the crucible supporting rod 121 up and down. In this way, the temperature gradient 440 near the melt surface 430 of the feedstock 110 can more easily fall in the desired range. Heating of lower portions of the crucible 120 more favorably proceeds, and the amount of radiation heat directed upwardly toward the melt surface 430 from the heater 140 decreases as the vertical distance between the melt surface 430 and the upper end of the heater 140 becomes smaller, or, in other words, as the heater 140 becomes shorter relative to the melt surface 430. This increases the temperature gradient 440. However, the melt of feedstock 110 increases its temperature distribution, and the convection 470 in the melt becomes excessively fast when heat is applied too favorably to lower portions of the crucible 120. This results in the flatness of the crystal growth boundary 420 being adversely affected. It is accordingly preferable to produce an appropriate temperature gradient 440 by adjusting the vertical distance 480 between the melt surface 430 and the upper end of the heater 140 while keeping it in balance with the state of the convection 470 in the melt.

Specifically, in the crystal growth step, the feedstock 110 is consumed as the crystal 410 is pulled up, and the melt surface 430 in the crucible 120 lowers its level from the preset initial value. In the present embodiment, the crucible supporting rod 121 is moved upward so as to vertically lift the crucible 120 and cancel out the downward displacement of the melt surface 430. That is, the vertical distance 480 between the melt surface 430 and the upper end of the heater 140 is maintained constant. The level of melt surface 430 is measured with the position detector 160. The measured value is input to a computer (not illustrated), and the computer uses the input value for processing. The result of processing is then used to control the crucible supporting rod 121 in such a manner as to raise the vertical position of the crucible 120.

The vertical distance 480 between the melt surface 430 and the upper end of the heater 140 is appropriately selected according to factors such as the size of the $ScAlMgO_4$ monocrystal to be produced.

In the present embodiment, the vertical distance 480 is preferably 19 mm to 29 mm.

When using the heating coil 240 instead of the heater 140, the heating coil 240 may be moved up and down, instead of moving the crucible supporting rod 121 in these directions. Alternatively, both the heating coil 240 and the crucible supporting rod 121 may be moved up and down to maintain the distance between the melt surface 430 and the upper end of the heating coil 240 constant relative to each other.

The computer may include a single system LSI (Large Scale Integration), or may be equipped with a plurality of dedicated electronic circuits. The height control of crucible 120 may be achieved by a processor executing instructions or software programs stored in a non-transitory memory. These processes may be achieved by a program executing section, such as a CPU or a processor, reading and executing software programs stored in a storage medium such as hard disc or semiconductor memory.

With the temperature gradient 440 produced in the manner described above and appropriately combined with the pulling rate 450 and the rotational speed 460 of the crystal pulling rod 150, it is possible to control the shape of the crystal growth boundary 420, and to bring the curvature radius r of the crystal plane of the $ScAlMgO_4$ substrate 301 and the uniformity of crystal orientation ($\rho^2$) to the desired ranges.

The vertical position of the melt surface 430 of the feedstock 110 is measured with the melt-level-position detector 160 also when the high-frequency heating furnace 200 is used to perform the crystal growth step. The temperature gradient 440 near the melt surface of the feedstock 110 can be adjusted in the same fashion by moving the heating coil 240 up and down so as to adjust the vertical distance 480 between the melt surface 430 of the feedstock 110 and the upper end of the heating coil 240.

With the $ScAlMgO_4$ single crystal (and, in turn, the $ScAlMgO_4$ substrate) fabricated in the manner described above, the $ScAlMgO_4$ substrate becomes less susceptible to cracking during or after the formation of the group III nitride crystal, and the yield of group III nitride semiconductor improves.

EXAMPLES

The following describes the present disclosure in greater detail using Examples. It is to be noted, however, that the scope of the present disclosure is not to be narrowly construed from the Examples below.

Examples

The resistance heating furnace 100 of FIG. 1 or the high-frequency heating furnace 200 of FIG. 2 described in the embodiment was used to grow a $ScAlMgO_4$ single crystal. A mixture of $Sc_2O_3$, $Al_2O_3$, and MgO ($Sc_2O_3$:$Al_2O_3$:MgO=27.5%:26.5%:46.0% (atom %)) was used as a feedstock for new crystal growth. After being sintered, the mixture was charged into an iridium crucible 120, and heated and melted to obtain a melt of feedstock 110. A seed crystal 152 was then brought into contact with the melt of feedstock 110, and a $ScAlMgO_4$ single crystal having an outer diameter ϕ of 65 mm was grown by pulling the generated crystal with the crystal pulling rod 150 under rotation. The pulling rate 450 and rotational speed 460 of the crystal pulling rod 150, and the vertical distance 480 between the melt surface 430 and the upper end of the heat source (the upper end of the heater 140 or heating coil 240) were set to the conditions shown in Table 1 for Examples 1 to 8. The vertical distance 480 was held constant using the melt-level-position detector 160.

TABLE 1

| | Pulling rate [mm/h] | Rotational speed [rpm] | Vertical distance between melt surface and upper end of heat source [mm] |
| --- | --- | --- | --- |
| Example 1 | 0.7 | 5 | 23 |
| Example 2 | 0.5 | 5 | 19 |
| Example 3 | 0.5 | 5 | 21 |
| Example 4 | 0.5 | 5 | 23 |
| Example 5 | 0.5 | 5 | 25 |
| Example 6 | 0.5 | 5 | 29 |
| Example 7 | 0.5 | 3 | 27 |
| Example 8 | 0.3 | 3 | 23 |

After the crystal growth step, the $ScAlMgO_4$ single crystal, cooled, was taken out, and fabricated into a $ScAlMgO_4$ substrate 301 having an outer diameter ϕ of 60 mm and a thickness of 400 μm. After the process, the $ScAlMgO_4$ substrate 301 had one of its cleave surfaces as an epitaxial growth surface.

An X-ray diffractometer D8 DISCOVER (manufactured by Bruker AXS) was used to evaluate the curvature radius of the crystal plane of the $ScAlMgO_4$ substrate 301, and the uniformity of crystal orientation. An X-ray rocking curve measurement was taken at a 4.8-mm pitch at 13 points lying on a straight line passing through the center of the substrate, with a beam width set to 1 mm×7 mm. The X-ray peak position (ω) was then determined for the diffraction spectrum of each X-ray rocking curve.

Figure 5:
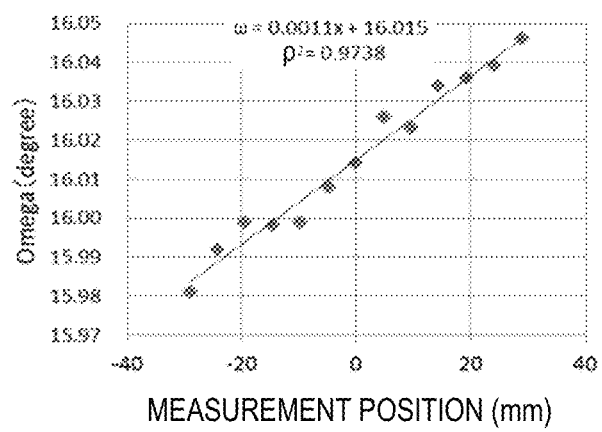
FIG. 5 is a graph representing a correlation between X-ray peak position ω and measurement position in the ScAlMgO$_4$ substrate of Example 1 in an embodiment of the present disclosure.

FIG. 5 is a graph representing a correlation between X-ray peak position ωi and measurement position Xi obtained in Example 1. In the graph, the regression line ω=aX+b had a slope a of 0.0011, and the absolute value of curvature radius r was calculated to be 52.1 m from slope a. The square of correlation coefficient ρ was 0.97. The result indicates that the extent of warping in the crystal plane of the substrate is relatively small, and that the crystal axes at different points within the crystal plane of the substrate are aligned.

Table 2 shows the absolute value of curvature radius r and the square of correlation coefficient ρ calculated from X-ray peak position ωi and measurement position Xi for Examples 1 to 8.

TABLE 2

| | Absolute value of curvature radius r [m] | Square of correlation coefficient ρ |
| --- | --- | --- |
| Example 1 | 52.1 | 0.97 |
| Example 2 | 52.0 | 0.94 |

TABLE 2-continued

|  | Absolute value of curvature radius r [m] | Square of correlation coefficient ρ |
|---|---|---|
| Example 3 | 127.3 | 0.86 |
| Example 4 | 114.6 | 0.96 |
| Example 5 | 95.5 | 0.82 |
| Example 6 | 59.2 | 0.81 |
| Example 7 | 63.7 | 0.83 |
| Example 8 | 143.2 | 0.95 |

A buffer layer 302 of amorphous or polycrystalline InGaN with an In content of 3 atom % and having a thickness of 20 nm was formed on the ScAlMgO$_4$ substrates 301 of Examples 1 to 8. A group III nitride crystal 303 of monocrystalline GaN having a thickness of 2 μm was then formed on the buffer layer 302 to fabricate a group III nitride semiconductor 300. In forming the group III nitride crystal 303, the MOCVD method was used for epitaxial growth, and the crystal was formed at a temperature of 1,125° C.

The substrate was taken out after cooling the device. Warping or cracking was not observed in any of the substrates of Examples 1 to 8, and the group III nitride semiconductors 300 produced from these substrates were all desirable.

Comparative Examples

ScAlMgO$_4$ single crystals were grown using a traditional configuration without the melt-level-position detector 160. Other procedures are the same as in Examples, except that the pulling rate 450 and rotational speed 460 of the crystal pulling rod 150 were set without adjusting the vertical distance 480 between the melt surface 430 of the feedstock 110 and the upper end of the heat source (the upper end of the heater 140 or heating coil 240).

The pulling rate 450 and rotational speed 460 of the crystal pulling rod 150 were set to the conditions shown in Table 3 for Comparative Examples 1 to 7. Comparative Examples 1 to 4 represent the results of crystal growth conducted four times at the same pulling rate 450 and rotational speed 460 set in Example 1, without adjusting the vertical distance 480 between the melt surface 430 of the feedstock 110 and the upper end of the heat source. Specifically, the crystals produced in Comparative Examples 1, 2, 3, and 4 are crystals obtained after being pulled up once, twice, three times, and four times, respectively. In Comparative Examples 5 to 7, crystals were grown with three patterns of rotational speeds 460 at the same pulling rate 450 set in Example 2, without adjusting the vertical distance 480 between the melt surface 430 of the feedstock 110 and the upper end of the heat source.

TABLE 3

|  | Pulling rate [mm/h] | Rotational speed [rpm] | Runs |
|---|---|---|---|
| Comparative Example 1 | 0.7 | 5 | 1 |
| Comparative Example 2 | 0.7 | 5 | 2 |
| Comparative Example 3 | 0.7 | 5 | 3 |
| Comparative Example 4 | 0.7 | 5 | 4 |
| Comparative Example 5 | 0.5 | 5 | — |
| Comparative Example 6 | 0.5 | 3 | — |
| Comparative Example 7 | 0.5 | 2 | — |

The crystal growth step was followed by fabrication of a ScAlMgO$_4$ substrate 301, and X-ray diffraction evaluations were conducted for the curvature radius r of the crystal plane, and the uniformity of crystal orientation (square of correlation coefficient ρ), using the same procedures described in Examples.

Figure 6:
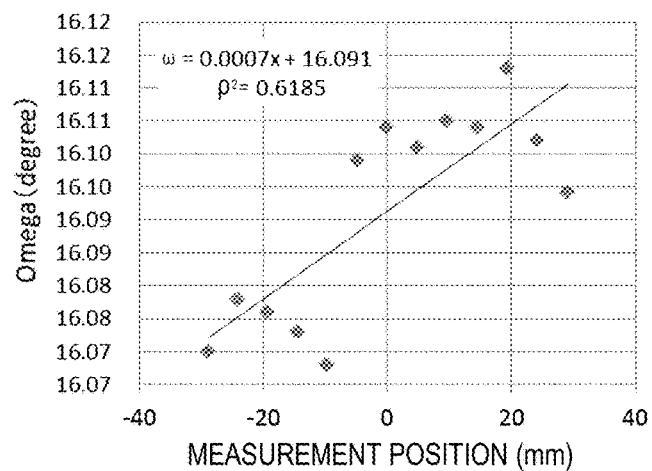
FIG. 6 is a graph representing a correlation between X-ray peak position ω and measurement position in the ScAlMgO$_4$ substrate of Comparative Example 1 in an embodiment of the present disclosure.

FIG. 6 is a graph representing a correlation between X-ray peak position ω and measurement position obtained in Comparative Example 1. The regression line ω=aX+b had a slope a of 0.0007, and the absolute value of curvature radius r was calculated to be 81.9 m from slope a. The square of correlation coefficient ρ was 0.62. The small square value of correlation coefficient ρ, which represents the extent of alignment of crystal axes at different points within the crystal plane of the substrate, indicates that the crystal axes are not aligned, though the curvature radius r, which represents the extent of warping in the crystal plane of the substrate, was relatively small.

Figure 7:
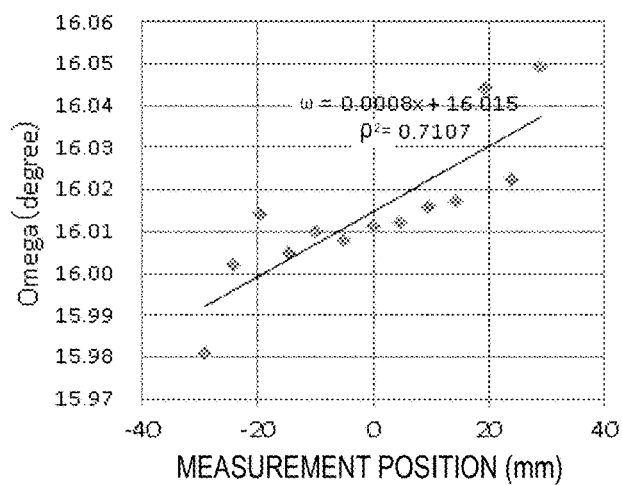
FIG. 7 is a graph representing a correlation between X-ray peak position ω and measurement position in the ScAlMgO$_4$ substrate of Comparative Example 5 in an embodiment of the present disclosure.

FIG. 7 is a graph representing a correlation between X-ray peak position ω and measurement position obtained in Comparative Example 5. The regression line ω=aX+b had a slope a of 0.0008, and the absolute value of curvature radius r was calculated to be 71.6 m from slope a. The square of correlation coefficient ρ was 0.71. As in Comparative Example 1, the small square value of correlation coefficient ρ, which represents the extent of alignment of crystal axes at different points within the crystal plane of the substrate, indicates that the crystal axes are not aligned, though the curvature radius r, which represents the extent of warping in the crystal plane of the substrate, was relatively small.

Table 4 shows the curvature radius r, and the square of correlation coefficient ρ calculated from X-ray peak position ω and measurement position for Comparative Examples 1 to 7.

TABLE 4

|  | Absolute value of curvature radius r [m] | Square of correlation coefficient ρ |
|---|---|---|
| Comparative Example 1 | 81.9 | 0.62 |
| Comparative Example 2 | 114.6 | 0.01 |
| Comparative Example 3 | 52.1 | 0.79 |
| Comparative Example 4 | 143.2 | 0.06 |
| Comparative Example 5 | 71.6 | 0.71 |
| Comparative Example 6 | 191.0 | 0.12 |
| Comparative Example 7 | 44.1 | 0.94 |

The buffer layer 302 and the group III nitride crystal 303 were formed on the ScAlMgO$_4$ substrates 301 of Comparative Examples 1 to 7, using the same epitaxial growth method used in Examples.

The substrate was taken out after cooling the device. The ScAlMgO$_4$ substrates 301 of Comparative Examples 1 to 7 all had cracks as a result of generated stress due to warping, and failed to produce desirable group III nitride semiconductors 300.

Comparative Examples with Pulling Rate Outside of Appropriate Range

The pulling rate 450 of the crystal pulling rod 150 was increased from the rates set in Examples while keeping a constant vertical distance 480 between the melt surface 430 of the feedstock 110 and the upper end of the heat source (the upper end of the heater 140 or heating coil 240) as in Examples using the melt-level-position detector 160. The other procedures are the same as in Example 1, and the ScAlMgO$_4$ single crystal was grown in the same manner described in Examples. The pulling rate 450 and rotational speed 460 of the crystal pulling rod 150, and the vertical distance 480 measured between the melt surface 430 and the upper end of the heat source (the upper end of the heater 140 or heating coil 240) using the melt-level-position detector 160 were set to the conditions shown

TABLE 5

|  | Pulling-rate [mm/h] | Rotational speed [rpm] | Vertical distance between melt surface and upper end of heat source [mm] |
|---|---|---|---|
| Comparative Example 8 | 1.0 | 5 | 23 |
| Comparative Example 9 | 1.0 | 5 | 28 |

The crystal growth step was followed by fabrication of a ScAlMgO$_4$ substrate 301, and X-ray diffraction evaluations were conducted for the curvature radius of the crystal plane, and the uniformity of crystal orientation, using the same procedures used in Examples.

Figure 8:
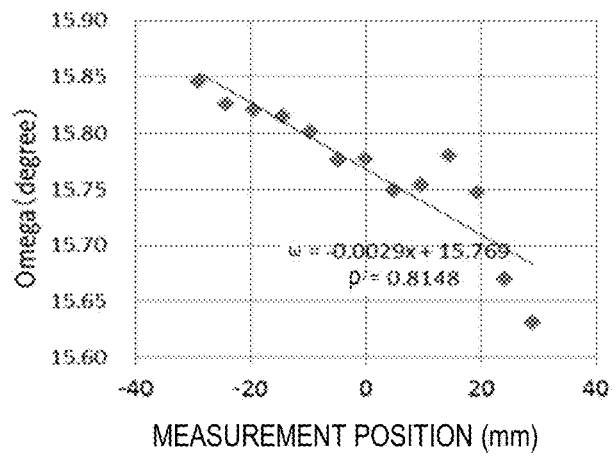
FIG. 8 is a graph representing a correlation between X-ray peak position ω and measurement position in the ScAlMgO$_4$ substrate of Comparative Example 9 in an embodiment of the present disclosure.

FIG. 8 is a graph representing a correlation between X-ray peak position ω and measurement position obtained in Comparative Example 9. The regression line ω=aX+b had a slope a of −0.0029, and the absolute value of curvature radius r was calculated to be 19.8 m from slope a. The square of correlation coefficient ρ was 0.81. The result indicates that, while the crystal axes at different points within the crystal plane of the substrate are aligned, the extent of warping (curvature radius r) in the crystal plane of the substrate is relatively large.

Table 6 shows the curvature radius r, and the square of correlation coefficient ρ calculated from X-ray peak position ω and measurement position for Comparative Examples 8 and 9.

TABLE 6

|  | Absolute value of curvature radius r [m] | Square of correlation coefficient ρ |
|---|---|---|
| Comparative Example 8 | 11.9 | 0.94 |
| Comparative Example 9 | 19.8 | 0.81 |

The buffer layer 302 and the group III nitride crystal 303 were formed on the ScAlMgO$_4$ substrates 301 of Comparative Examples 8 and 9, using the same epitaxial growth method used in Examples.

The substrate was taken out after cooling the device. The ScAlMgO$_4$ substrates 301 of Comparative Examples 8 and 9 both had cracks as a result of generated stress due to warping, and failed to produce desirable group III nitride semiconductors 300.

These results demonstrated that a ScAlMgO$_4$ substrate 301 having a curvature radius r and the square of correlation coefficient ρ within the foregoing desirable ranges can be manufactured when the crystal pulling rate of ScAlMgO$_4$ monocrystal production (crystal growth step) is controlled to be 0.7 mm/h or less, and when the vertical distance 480 between the melt surface 430 and the upper end of the heater 140 is controlled to be 19 mm to 29 mm. In addition to these conditions, the pulling rate is more preferably 0.3 mm/h or more.

Figure 9:
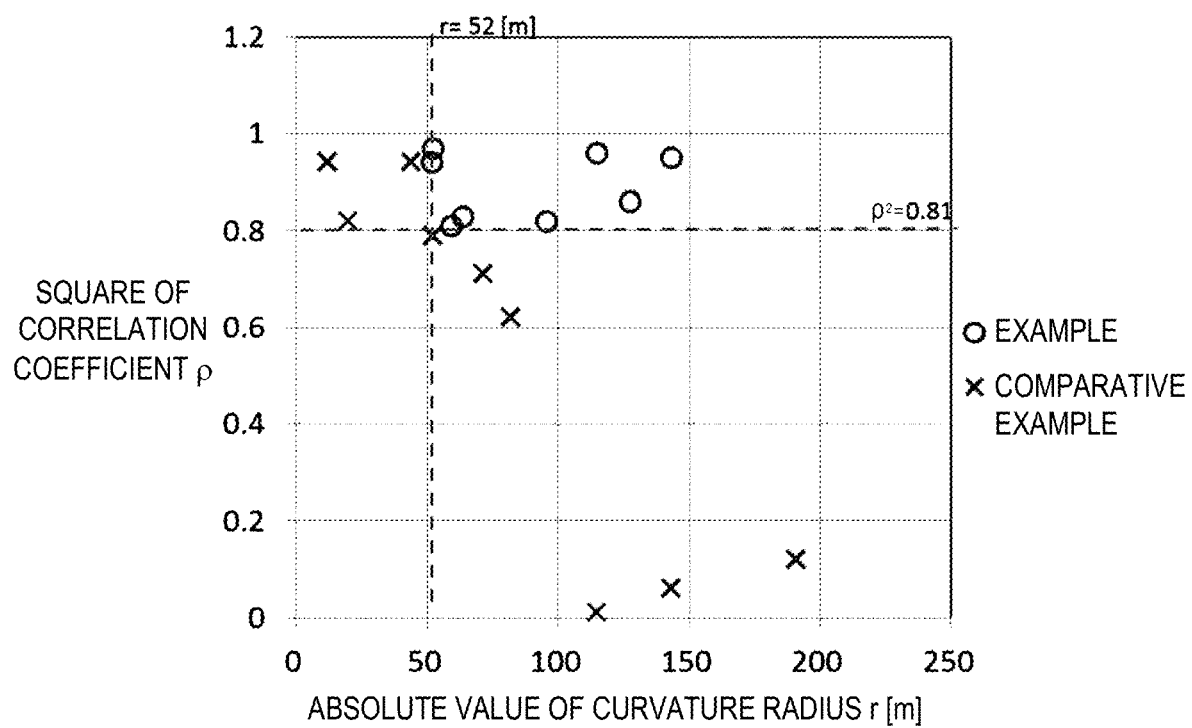
FIG. 9 is a graph representing the absolute value of the curvature radius r of a crystal plane, and the square value of correlation coefficient ρ for the ScAlMgO$_4$ substrates of Examples 1 to 8 and Comparative Examples 1 to 9 of an embodiment of the present disclosure.

The absolute value of the curvature radius r of the crystal plane of the ScAlMgO$_4$ substrate 301, and the square of correlation coefficient ρ are described below with regard to their preferred ranges. FIG. 9 is a graph representing the absolute value of the curvature radius r of the crystal plane of the ScAlMgO$_4$ substrate 301, and the square value of correlation coefficient ρ for Examples 1 to 8 and Comparative Examples 1 to 9. In the graph, the open circle represents no cracking, and the cross symbol represents cracking in group III nitride semiconductors 300 produced from these substrates. As can be seen from FIG. 9, desirable group III nitride semiconductors 300 with no cracks can be obtained when the absolute value of curvature radius r is 52 m or more, and when the square of correlation coefficient ρ is 0.81 or more.

The production of ScAlMgO$_4$ substrate 301 may include testing whether the curvature radius r and the square of correlation coefficient ρ fall in the predetermined ranges, and determining that the products are acceptable when the curvature radius r and the square of correlation coefficient ρ fall in these ranges. Specifically, the ScAlMgO$_4$ substrate (RAMO$_4$ substrate) produced is subjected to X-ray rocking curve measurements at a plurality of positions Xi lying on a straight line passing through the center of the substrate, and the X-ray peak position ωi in the diffraction spectrum of the X-ray rocking curve from each position Xi is specified. The ScAlMgO$_4$ substrate (RAMO$_4$ substrate) may then be determined as being acceptable when the curvature radius r obtained from the measured values is 52 m or more, and when the calculated square value of correlation coefficient ρ is 0.81 or more. The acceptable substrate can then be used for manufacture of electronic devices such as LEDs and power devices. The rejected substrate may be discarded, or may be melted for reuse as feedstock.

With the present disclosure, cracking of a substrate in forming a group III nitride crystal can be reduced to improve the quality of the group III nitride semiconductor produced. This makes the present disclosure useful as a base substrate of devices such as light emitting diodes (LEDs) and laser diodes (LDs).

What is claimed is:

1. A RAMO$_4$ substrate comprising a single crystal represented by general formula RAMO$_4$, wherein R represents one or more trivalent elements selected from the group consisting of Sc, In, Y, and lanthanoid elements, A represents one or more trivalent elements selected from the group consisting of Fe(III), Ga, and Al, and M represents one or more divalent elements selected from the group consisting of Mg, Mn, Fe(II), Co, Cu, Zn, and Cd, the RAMO$_4$ substrate having a crystal plane with an absolute value of a curvature radius r of 52 m or more, and a square value of correlation coefficient p of 0.81 or more, wherein the curvature radius r is calculated from a regression line obtained from a relationship between X-ray peak position ωi and position Xi after the X-ray peak position ωi is specified in a diffraction spectrum of an X-ray rocking curve measured at each of a plurality of positions Xi (i=1, 2, 3, ..., n) lying on a straight line passing through a center of a surface of the RAMO4 substrate, wherein the X-ray peak position ωi is expressed as an angular position, wherein the relationship between the X-ray peak position ωi and the position Xi is determined by plotting the X-ray peak position ωi versus the position Xi in a graph, wherein each of the plurality of positions Xi lies on a different point on the straight line, wherein the square value of correlation coefficient p is calculated from the X-ray peak position ωi, the position Xi, and the number n of the positions Xi, using the following formula, $$\rho = \frac{\frac{1}{n}\sum_{i=1}^{n}(Xi - \overline{X})(\omega i - \overline{\omega})}{\sqrt{\frac{1}{n}\sum_{i=1}^{n}(Xi - \overline{X})^2} \sqrt{\frac{1}{n}\sum_{i=1}^{n}(\omega i - \overline{\omega})^2}}$$

wherein $\overline{\omega}$ represents a mean value of ωi expressed as $$\overline{\omega} = \frac{\sum_{i=1}^{n}\omega i}{n},$$

$\overline{X}$ represents a mean value of Xi expressed as $$\overline{X} = \frac{\sum_{i=1}^{n}Xi}{n},$$

and n represents a natural number larger than or equal to 2, wherein, when the regression line is represented by ω=aX+b, a and b are represented by the following formulae, $$a = \frac{\sum_{i=1}^{n}\{(Xi - \overline{X})(\omega i - \overline{\omega})\}}{\sum_{i=1}^{n}(Xi - \overline{X})^2}$$

$$b = \overline{\omega} - a\,\overline{X}$$

where $\overline{\omega}$ represents the mean value of ωi, $\overline{X}$ represents the mean value of Xi, and n represents the number of the positions Xi, and wherein the curvature radius r is represented by the following formula, $$r = a\frac{180}{\pi}.$$

2. The RAMO$_4$ substrate according to claim 1, wherein R is Sc, A is Al, and M is Mg in the general formula RAMO$_4$.

3. The RAMO$_4$ substrate according to claim 1, which has a thickness in a range of from 100 μm to 1,000 μm.

4. The RAMO4 substrate according to claim 1, which has a diameter in a range of from 25 mm to 200 mm.

5. The RAMO$_4$ substrate according to claim 2, which has a thickness in a range of from 100 μm to 1,000 μm.

6. A group III nitride semiconductor comprising:
the RAMO$_4$ substrate of claim 1;
a buffer layer disposed on an epitaxial growth surface forming one surface of the RAMO4 substrate; and
a group III nitride crystal disposed on the buffer layer.

7. The group III nitride semiconductor according to claim 6, wherein the buffer layer is an amorphous, monocrystalline, or polycrystalline layer formed of a compound represented by InAlGaN.

8. The group III nitride semiconductor according to claim 6, wherein the group III nitride crystal is GaN or AlN.

* * * * *